United States Patent
Kanda

(10) Patent No.: US 7,393,580 B2
(45) Date of Patent: Jul. 1, 2008

(54) LAYERED BOARD AND ELECTRONIC APPARATUS HAVING THE LAYERED BOARD

(75) Inventor: Takashi Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 11/258,856

(22) Filed: Oct. 27, 2005

(65) Prior Publication Data

US 2007/0009718 A1    Jan. 11, 2007

(30) Foreign Application Priority Data

Jul. 7, 2005    (JP)    ............... 2005-198218

(51) Int. Cl.
    *B32B 3/00*    (2006.01)
    *H05K 1/14*    (2006.01)
(52) U.S. Cl. ............ 428/209; 428/192; 174/250; 174/255; 361/736; 361/742
(58) Field of Classification Search ............ 428/209, 428/210, 901, 192; 174/250, 255; 361/736, 361/742
    See application file for complete search history.

(56) References Cited

U.S. PATENT DOCUMENTS 4,963,425 A * 10/1990 Buchanan et al. ............ 428/212
5,633,072 A * 5/1997 Middelman et al. ......... 428/209
6,108,903 A * 8/2000 Nakatani et al. ............ 29/852
6,207,904 B1 * 3/2001 Kramer et al. ............ 174/255
6,238,777 B1    5/2001 Oda et al.
6,734,541 B2    5/2004 Shimoe et al.

FOREIGN PATENT DOCUMENTS

| JP | 10-144504 | 5/1998 |
| JP | 11-112114 | 4/1999 |
| JP | 2003-7962 | 1/2003 |

* cited by examiner

*Primary Examiner*—Cathy F. Lam
(74) *Attorney, Agent, or Firm*—Arent Fox LLP.

(57) ABSTRACT

A layered board is disclosed which can avoid the occurrence of cracks in a core layer due to shearing stress caused by a difference in coefficient of thermal expansion between the core layer and a buildup layer. The layered board includes a core layer which serves as a printed board, a buildup layer which includes an insulation part and a wiring part, is overlaid on the core layer, and is electrically connected to the core layer, and an edge layer formed at least at an edge on the periphery of the core layer, the edge layer being different from the core layer. Alternatively, the core layer projects outward from an edge on the periphery of the buildup layer.

11 Claims, 16 Drawing Sheets

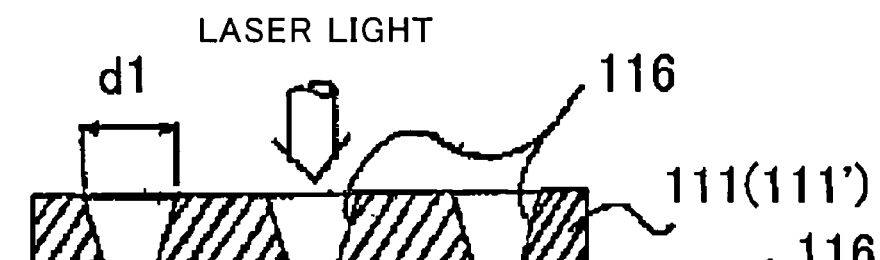
FIG. 5A
FIG. 5B
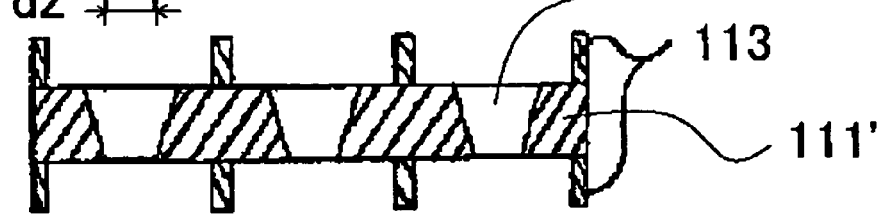
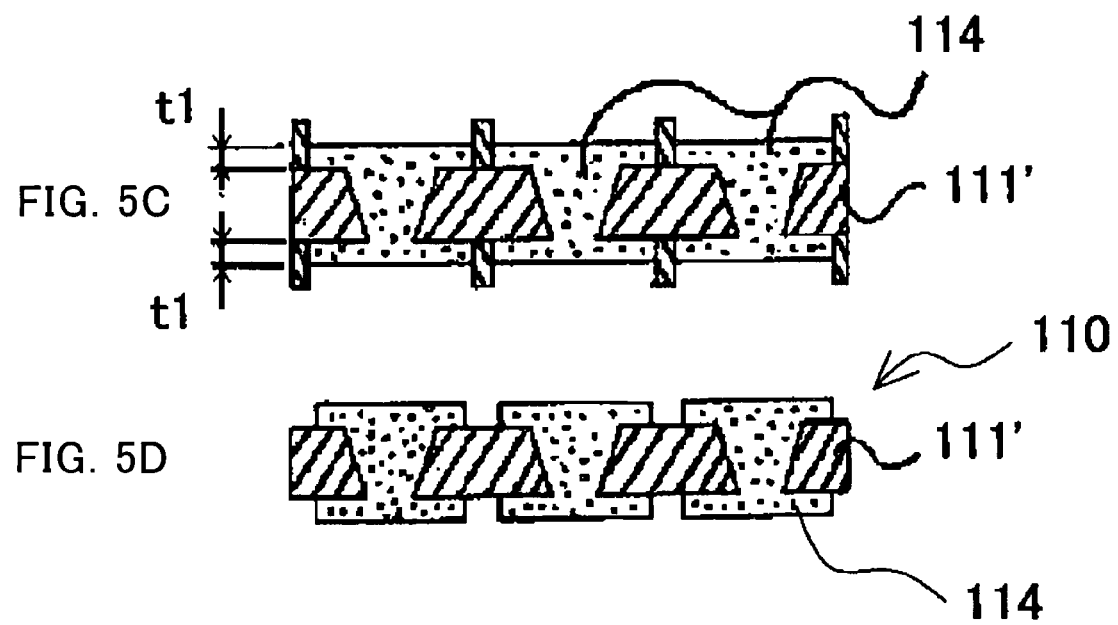
FIG. 5C
FIG. 5D

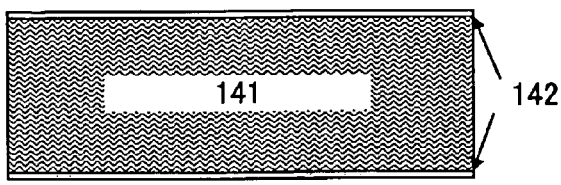
FIG. 7A
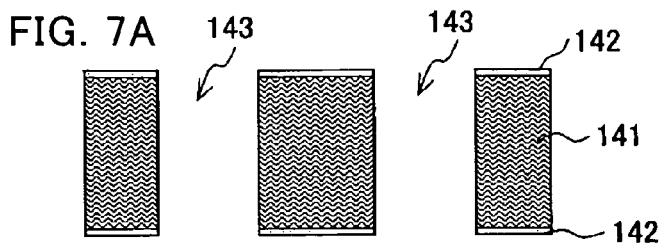
FIG. 7B
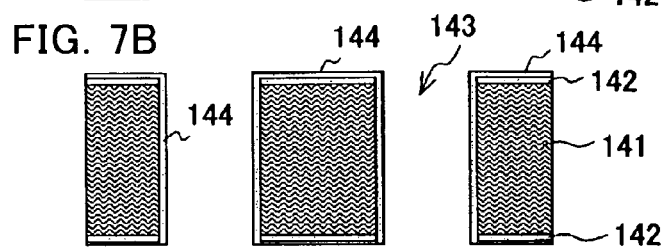
FIG. 7C
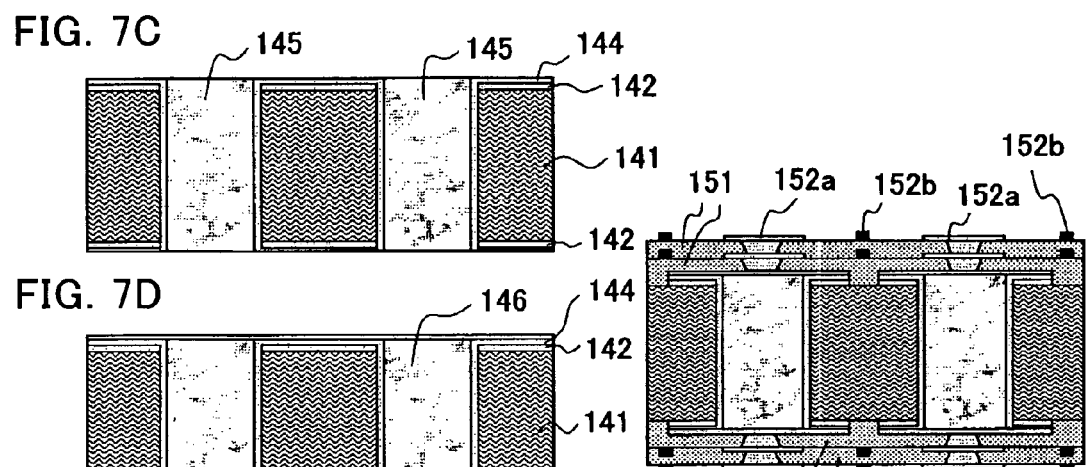
FIG. 7D
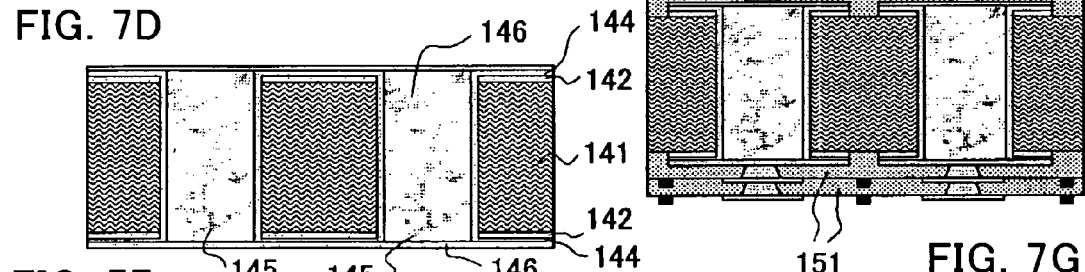
FIG. 7E
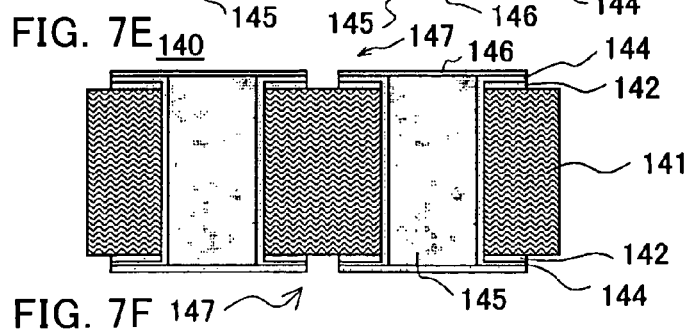
FIG. 7F
FIG. 7G

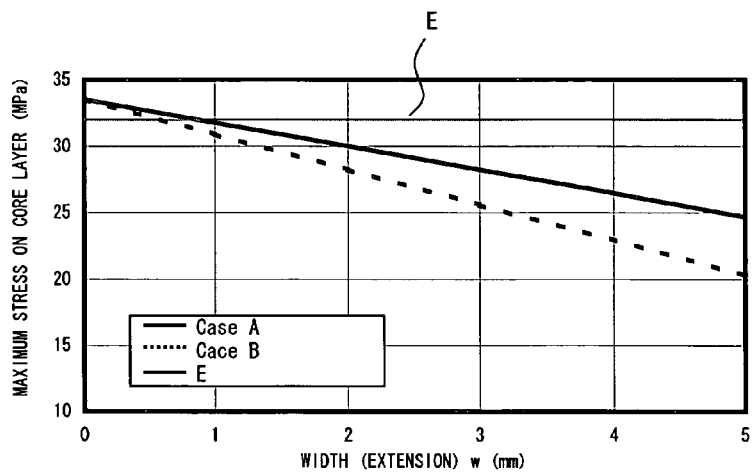

Case A
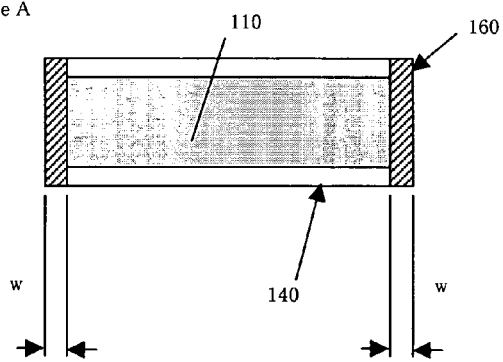

| CORE BOARD | THICKNESS | 2.5mm |
|---|---|---|
| | COEFFICIENT OF THERMAL EXPANSION | 1ppm/°C |
| | SIZE | □500mm |
| BUILDUP LAYER | THICKNESS | 0.3mm |
| | COEFFICIENT OF THERMAL EXPANSION | 20ppm/°C |
| | SIZE | □500mm |
| EDGE LAYER | COEFFICIENT OF THERMAL EXPANSION | 20ppm/°C |
| | WIDTH (w) | VARIABLE |

Case B
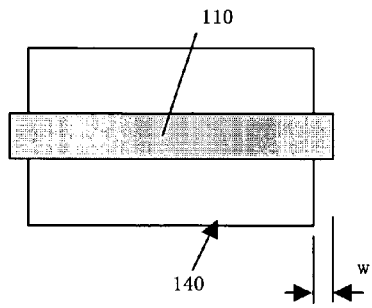

| CORE BOARD | THICKNESS | 2.5mm |
|---|---|---|
| | COEFFICIENT OF THERMAL EXPANSION | 1ppm/°C |
| | SIZE | □500mm |
| BUILDUP LAYER | THICKNESS | 0.3mm |
| | COEFFICIENT OF THERMAL EXPANSION | 20ppm/°C |
| | SIZE | VARIABLE |

FIG. 11

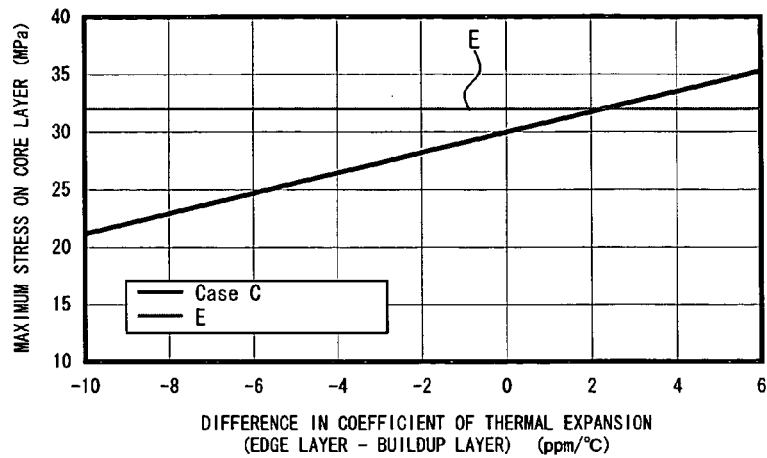
Case C
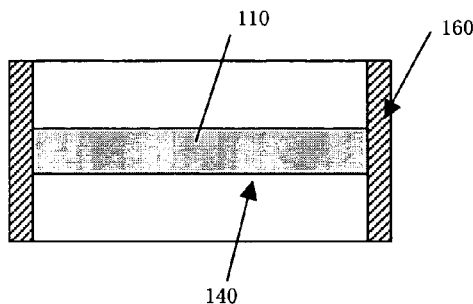
| CORE BOARD | THICKNESS | 2.5mm |
|---|---|---|
| | COEFFICIENT OF THERMAL EXPANSION | 1ppm/°C |
| | SIZE | □500mm |
| BUILDUP LAYER | THICKNESS | 0.3mm |
| | COEFFICIENT OF THERMAL EXPANSION | 20ppm/°C |
| | SIZE | □500mm |
| EDGE LAYER | COEFFICIENT OF THERMAL EXPANSION | VARIABLE |
| | WIDTH | 2mm |
FIG. 12

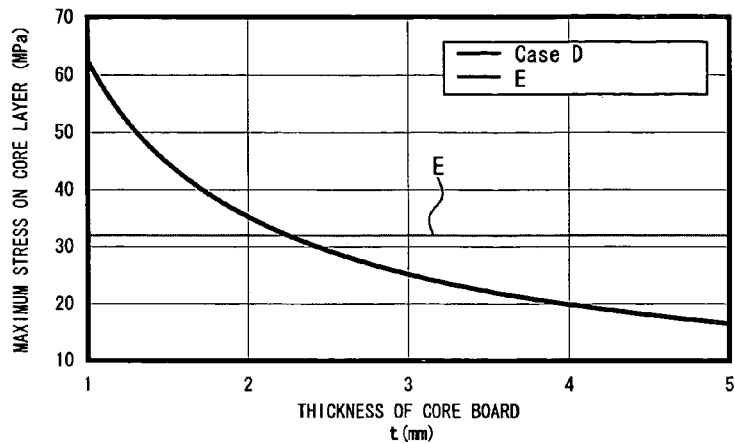
Case D
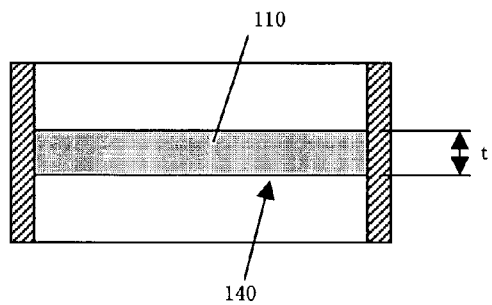
| CORE BOARD | THICKNESS (t) | VARIABLE |
|---|---|---|
| | COEFFICIENT OF THERMAL EXPANSION | 1ppm/°C |
| | SIZE | □500mm |
| BUILDUP LAYER | THICKNESS | 0.3mm |
| | COEFFICIENT OF THERMAL EXPANSION | 20ppm/°C |
| | SIZE | □500mm |
| RELIEF LAYER | COEFFICIENT OF THERMAL EXPANSION | 20ppm/°C |
| | WIDTH | 2mm |
FIG. 13

PRIOR ART

LAYERED BOARD AND ELECTRONIC APPARATUS HAVING THE LAYERED BOARD

This application claims foreign priority based on Japanese Patent Application No. 2005-198218 filed on Jul. 7, 2005, which is hereby incorporated by reference herein in its entirety as if fully set forth herein.

BACKGROUND OF THE INVENTION

The present invention relates to a layered board (hereinafter referred to as a "buildup board") which includes a core layer and a buildup layer overlaid thereon.

The buildup boards have conventionally been used for laptop personal computers (PCs), digital cameras, servers, cellular phones, etc, to meet miniaturization and weight saving demands of electronic apparatuses. The buildup board is manufactured by using a double-sided printed board or a multilayer printed board as a core, and overlaying an interfacially connected buildup layer (which is a laminate of an insulating layer and a wiring layer) on both surfaces or a single surface of the core through the microvia technology (see Japanese Patent Application Laid-Open No. 2003-218519).

An electronic component of a layered type such as the buildup board has the problems of delamination at a boundary between layers, cracks, and warping of the electronic component due to a difference in coefficient of thermal expansion between a plurality of bonded layers.

The present applicant has proposed the technique for enabling the prevention of warping of a buildup board, delamination, etc, by controlling the coefficient of thermal expansion, the thickness, the modulus of longitudinal elasticity, etc, of each layer in the buildup board.

Japanese Patent Application Laid-Open No. 11 (1999)-112114 has proposed the technique in which a buildup board includes a closed curve pattern which surrounds a conductive pattern in a surface where an insulating layer is formed on a surface of a core layer to prevent cracks at the boundary of the conductive pattern in the insulating layer.

In addition, Japanese Patent Application Laid-Open No. 2003-7962 has disclosed the technique in which a semiconductor layered module employs different adhesives for bonding a board and a semiconductor chip and for bonding element modules each consisting of the board and the semiconductor chip to prevent separation between element packages, warping of the layered module, etc.

Japanese Patent Application Laid-Open No. 10 (1998)-144504 has disclosed the technique which, although not in an electronic component of a layered type, in a chip type thermistor surface-mounted to a board, prevents stress produced due to a difference in coefficient of thermal expansion between a board or an electrode on the board and solder from affecting the body of the thermistor through an external electrode of the thermistor to cause cracks in the thermistor body. In the technique, a conductive resin layer is formed between the thermistor body and the external electrode to relieve the stress applied to the thermistor body.

The buildup board is subjected to a temperature cycling test before it is shipped as a product. The temperature cycling test is performed to check whether or not normal operation is maintained even after cooling to a temperature of −65° C. and heating to a temperature of 150° C. are repeated a predetermined number of times, for example.

When sudden temperature changes are made in such a temperature cycling test, however, as shown in FIG. 17, shearing stress F is applied to a core layer 310 in its in-plane direction due to a difference in coefficient of thermal expansion between the core layer 310 and buildup layers 320, that is, a difference in a contraction amount or an expansion amount. The shearing stress F is mainly applied at the edges on the periphery of the core layer 310 (the outermost parts in the in-plane direction, particularly the corner parts) and may cause cracks 330 in the core layer 310. Especially when the core layer 310 is formed by using a carbon-based material (for example, CFRP) or a silicon-based material with a coefficient of thermal expansion significantly lower than that of the buildup layer 320, the shearing stress often excesses the breaking strength of the core layer 310 and the cracks easily occur.

The core layer 310 and the buildup layer 320 are bonded together with an epoxy adhesive which has the effect of relieving stress produced at the bonding parts. However, it has little effect of reducing the abovementioned shearing stress applied to the core layer 310.

In addition, it is difficult even for the techniques proposed by the present applicants and disclosed in patent applications mentioned above to prevent such cracks in the core layer due to the shearing stress.

BRIEF SUMMARY OF THE INVENTION

It is an object of the present invention to provide a buildup board (a layered board) which can avoid the occurrence of cracks in a core layer due to shearing stress caused by a difference in coefficient of thermal expansion between the core layer and a buildup layer.

A layered board according to one aspect of the present invention includes a core layer which serves as a printed board, a buildup layer which includes an insulation part and a wiring part, is overlaid on the core layer, and is electrically connected to the core layer, and an edge layer formed at least at an edge on the periphery of the core layer, the edge layer being different from the core layer.

A layered board according to another aspect of the present invention includes a core layer which serves as a printed board, a buildup layer which includes an insulation part and a wiring part, is overlaid on the core layer, and is electrically connected to the core layer, wherein the core layer projects outward from an edge on the periphery of the buildup layer.

An electronic apparatus including the abovementioned layered board realizes another aspect of the present invention.

Other objects and further features of the present invention will become readily apparent from the following description of the preferred embodiments with reference to accompanying drawings.

BRIEF DESCRIPTION OF THE DRAWINGS

FIGS. 5A to 5D are schematic diagrams showing the manufacturing process of the core layer in Embodiment 1.

FIGS. 7A to 7G are schematic diagrams showing the manufacturing process of the buildup layer in Embodiment 1.

FIG. 11 is a graph showing a relationship between a width of an edge layer or a projection of the core layer and shearing stress working on the core layer in the buildup boards in Embodiments 1 and 3 of the present invention.

FIG. 12 is a graph showing a relationship between a coefficient of thermal expansion of the edge layer (a difference in coefficient of thermal expansion between the edge layer and the buildup layer) and shearing stress working on the core layer in the buildup board in Embodiment 1.

FIG. 13 is a graph showing a thickness of the core layer and shearing stress working on the core layer in the buildup layer in Embodiment 1.

DETAILED DESCRIPTION OF THE PREFERRED EMBODIMENTS

Preferred embodiments of the present invention will hereinafter be described with reference to the drawings.

Embodiment 1

Figure 1:
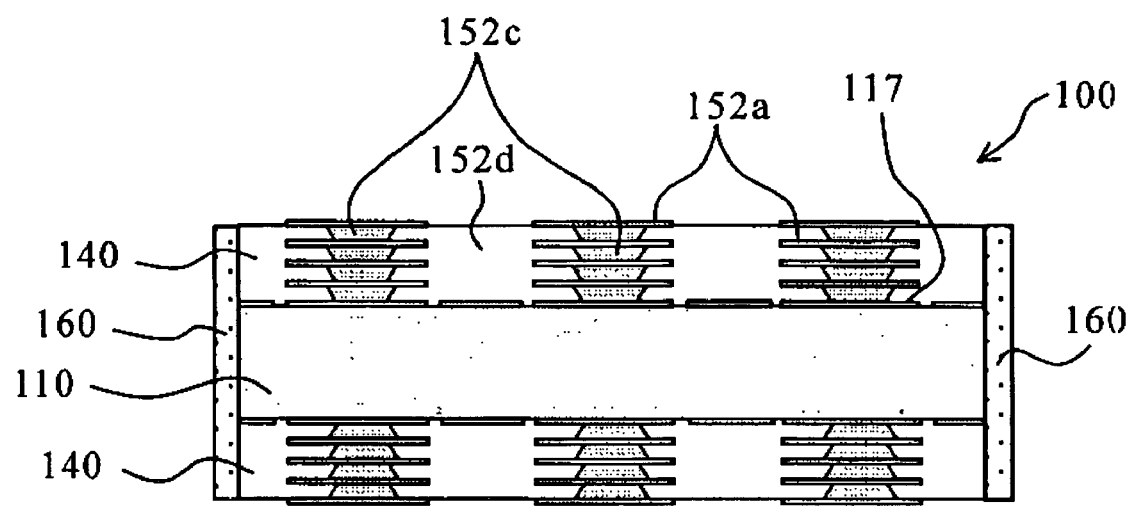
FIG. 1 is a section view showing a buildup board which is Embodiment of the present invention.

FIG. 1 shows an example of the structure of a buildup board as a layered board which is Embodiment 1 of the present invention. The buildup board 100 includes a core layer (also referred to as a core board) 110 serving as a printed board and multiplayer buildup layers 140 which are overlaid on both sides (the front side and the back side) of the core layer 110. The core layer 110 has a through-hole via (omitted in FIG. 1) formed therein to pass through the layer 110 in the thickness direction thereof. The though-hole via electrically connects the multiplayer buildup layers 140 on both sides. Each of the multiplayer buildup layers 140 on both sides is formed by layering a plurality of buildup layers each having an insulating part 152d and a conductive part 152a serving as a wiring part. The conductive parts 152a in the respective buildup layers are connected to each other through a conductor part 152c. Each conductive part 152a of the buildup layer closest to the core layer 110 is connected to a conductive pattern 117 formed on the front surface and the back surface of the core layer 110.

An edge layer 160 serving as a stress relief layer is formed at edges on the periphery of the core layer 110 and the buildup layer 140, that is, on outer edges in the in-plane direction (the horizontal direction in FIG. 1) of both layers.

While FIG. 1 shows a section view of the buildup board 100 in which the edge layer 160 is formed at each end on the left and right, the edge layer 160 is actually formed over the entire periphery thereof.

Figure 2:
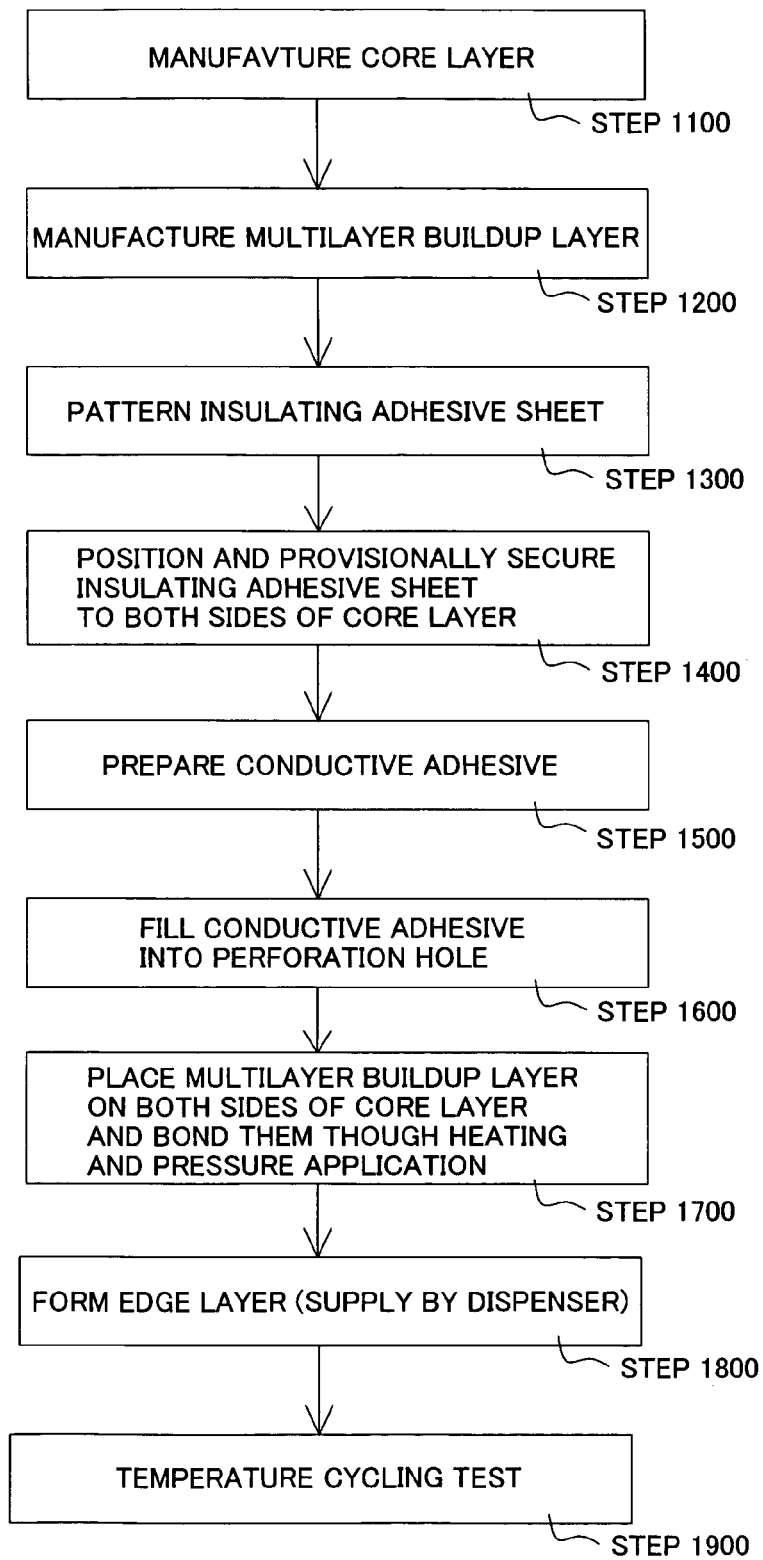
FIG. 2 is a flow chart showing a manufacturing process of the buildup board in Embodiment 1.

FIG. 2 shows a flow chart of a manufacturing process of the buildup board in Embodiment 1. First, the core layer is manufactured at step 1100.

Figure 3:
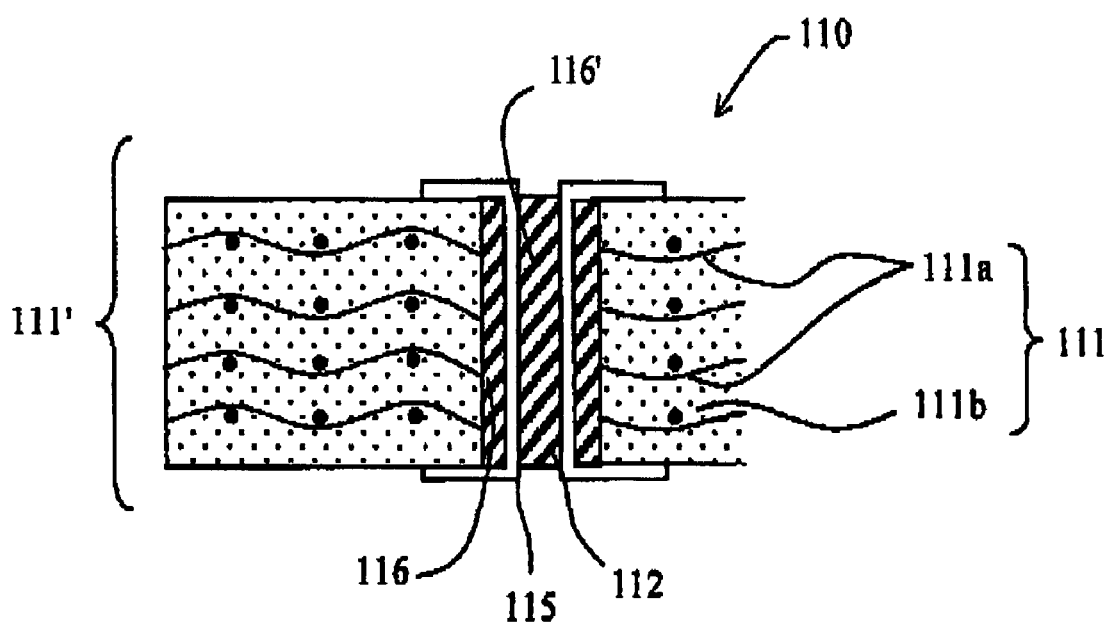
FIG. 3 is a section view showing the detailed structure of a core layer used in the buildup layer in Embodiment 1.

As shown in FIG. 3, the core layer 110 is formed by processing a plate of carbon fiber reinforced plastic (CFRP).

A CFRP plate 111 consists of a carbon fiber material 111a and a resin composition 111b which encompasses and hardens it.

In manufacturing the CFRP plate 111, a single carbon fiber material 111a is first impregnated with liquid resin composition. Next, the resin composition 111b is dried while the unhardened state is maintained, thereby forming a carbon fiber reinforced prepreg.

Next, a predetermined number of the prepregs thus formed are layered and pressed in the layering direction under heat to integrate the predetermined number of the prepregs. In this manner, the CFRP plate 111 is formed.

The carbon fiber material 111a is a carbon fiber cloth woven from carbon fiber thread formed by binding carbon fibers and is oriented to spread in the in-plane direction of the CFRP plate 111 (the core layer 110). In Embodiment 1, a plurality of carbon fiber materials are layered in the thickness direction and encompassed in the resin composition 111b. For the carbon fiber material 111a, a carbon fiber mesh or a carbon fiber nonwoven fabric may be employed instead of the carbon fiber cloth.

For the resin composition 111b, epoxy, polyimide, polycarbonate, polybutylene terephthalate, polyacrylate, polysulfone, etc, can be used, for example.

It should be noted that an inorganic filler may be dispersed in the resin composition 111b. This can reduce the coefficient of thermal expansion of the core layer isotropically in the in-plane direction and the thickness direction.

An insulating resin part 112 is formed to ensure electric insulation between the carbon fiber material 111a and a through-hole conductive part 115. For the material to form the insulating resin part 112, a resin similar to the resin composition 111b may be employed.

The core layer 110 thus formed includes the carbon fiber material 111a spreading in the in-plane direction as its base material, so that the core layer 110 has a low coefficient of thermal expansion in the in-plane direction. The content of the carbon fiber material 111a in the core layer 110 can be appropriately adjusted to set the coefficient of thermal expansion of the core layer 110 in the in-plane direction to, for example 0 to 17 ppm/° C., and preferably, 10 ppm/° C.

The present invention is not limited to the case where the abovementioned core layer including the CFRP plate 111 as its base material is used, but applicable to the case where a core layer (with a coefficient of thermal expansion of 3 ppm/° C.) containing silicon (Si) as its base material is used. However, these base materials and the coefficients of thermal expansion of the core layer are illustrative, and other base materials and different coefficients of thermal expansion may be used for the core layer in the present invention.

The present invention is particularly effective when it employs in the core layer a base material having a significantly lower coefficient of thermal expansion relative to a glass epoxy resin (with a coefficient of thermal expansion of 17 to 18 ppm/° C.) which is the base material of the buildup layer, later described. However, this does not mean the elimination of the application of the present invention to a buildup board which employs a core layer containing a glass epoxy resin as its base material.

The core layer 110 has a rectangular or circular shape when viewed from the front side or the back side in Embodiment 1, and for example, has holes for positioning at four positions (for example, at the corners of the rectangular shape) on the front and back. The core layer 110 includes a core and a through-hole and may or may not include a layered structure on both sides of the core. In general, the pitch of the layered structure is greater than the interlayer pitch of the multiplayer buildup layer 140.

Figure 4:
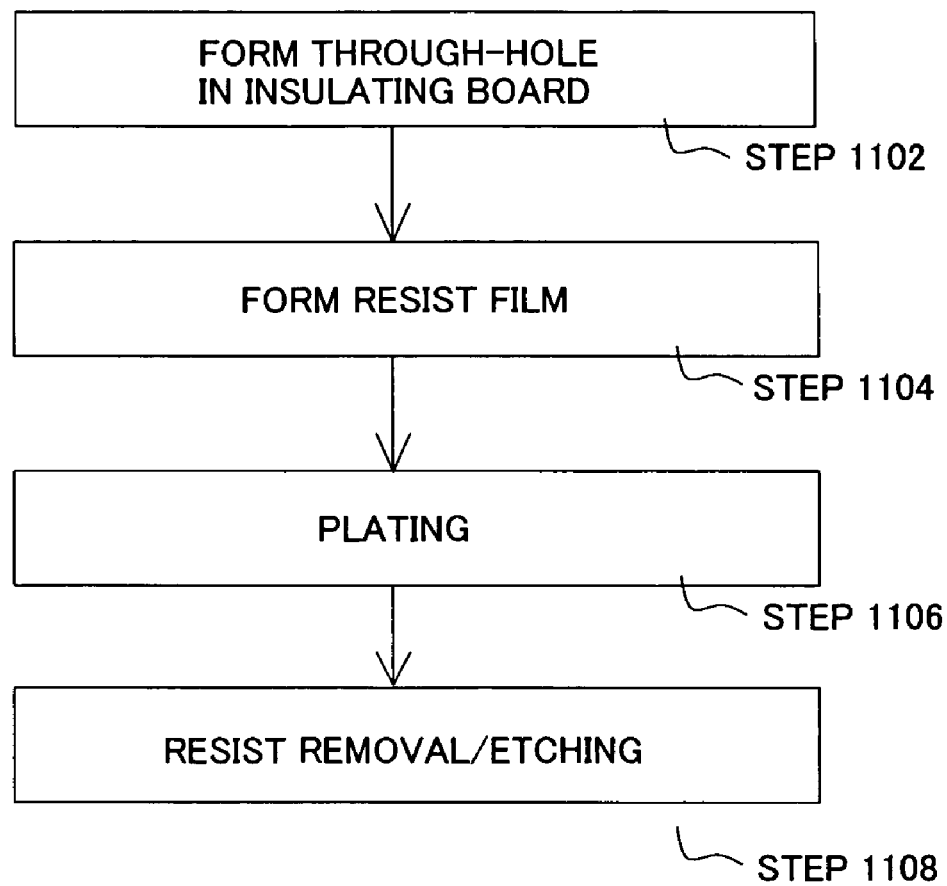
FIG. 4 is a flow chart showing a manufacturing process of the core layer in Embodiment 1.

Now, the manufacturing process of the core layer 110 is described in detail with reference to FIGS. 4 and 5A to 5D. FIG. 4 is a flow chart for explaining the manufacturing method of the core layer 110. FIGS. 5A to 5D are schematic section views showing the steps in FIG. 4. Description here will be made of an example of the manufacturing method of the core layer 110 which has no layered structure.

A perforation hole 116' shown in FIG. 3 is formed trough laser processing at a planned through-hole position in the CFRP plate 111 (hereinafter referred to as the insulating board 111), and the perforation hole 116' is filled with insulating resin to form the insulating resin part 112 in advance.

As shown in FIG. 5A, a perforation hole 116 having a smaller diameter than that of the perforation hole 116' is formed through laser processing at the planned through-hole position in the insulating board 111 (step 1102). The perforation hole 116 serves as the base shape of a through-hole. The insulating board (the CFRP plate) 111 prepared in Embodiment 1 has a thickness of 2.5 mm. In the laser processing, for example, a pulsed oscillation carbon dioxide gas laser processing apparatus is used. The perforation hole 116 may be formed through cutting with a drill or perforation with a punching die.

Then, electroless plating is performed on the inner surface of the perforation hole 116 and over the entire front and back surfaces of the insulating board 111 to a predetermined thickness.

Next, as shown in FIG. 5B, a dry film resist 113 is provided on the front and back surfaces of the insulating board 111 (step 1104). The dry film resist 113 is, for example, of an alkali development type with photosensitivity. Then, the dry film resist 113 is exposed for development to provide the resist film of a desired pattern.

Next, as shown in FIG. 5C, plating processing is performed (step 1106). The plating processing is conducted with a DC electrolytic plating method, and the electroless plated layer provided at step 1102 is used as an electrode. The material of a plated layer 114 may be copper, tin, silver, solder, alloy of copper and tin, alloy of copper and silver, etc, and any type of metal is applicable as long as the metal can be used for plating.

Then, the insulating board 111 with the dry film resist 113 provided at step 1103 is soaked in a plating bath. The plated layer 114 is grown simultaneously on the inner surface of the perforation hole 116 and over the entire front and back surfaces of the insulating board 111, and is increased in thickness. As the thickness of the plated layer 114 is increased, it is grown from the bottom part to the surface part of the perforation hole 116 and closes the bottom part of the perforation hole 116.

The plating processing is continued until a thickness t1 of the plated layer 114 on the front and back surfaces of the insulating board 11 reaches a predetermined thickness. Then, both of the front and back surfaces of the insulating board 111 including the perforation hole 116 are substantially flattened.

Thereafter, etching and resist removal are performed (step 1108). The etching is performed in order to smooth the rough plated layer 114 on both of the front and back surfaces of the insulating board 111 and to adjust the thickness of the plated layer 114 on both of the front and back surfaces. An etchant used is copper chloride.

Subsequently, as shown in FIG. 5D, the dry film resist 113 formed on the front and back surfaces of the insulating board 111 is removed by using a remover. The remover is, for example, an alkaline remover. As a result, the electroless plating provided at step 1102 is exposed in the layer under the removed dry film resist 113. Then, the electroless plating is etched. An etchant used is, for example, hydrogen persulfate. The insulating board 111 may have a layered structure.

The core layer 110 thus manufactured is subjected to a non-defective determination before it is bonded to the buildup layer 140. Only non-defective items are used at step 1700 shown in FIG. 2.

Next, the multiplayer buildup layer 140 is manufactured (step 1200). In Embodiment 1, the buildup layer 140 has a rectangular or circular shape with substantially the same size as the core layer 110 in the in-plane direction, and has holes for positioning at four positions (for example, at the corners of the rectangular shape), for example.

As described above, the buildup layer 140 has the insulating part 152d and the conductive parts 152a, 152c. The conductive parts 152a, 152c are electrically connected to the core layer 110. The buildup layer 140 has a layered structure and may or may not include a core inside.

Figure 6:
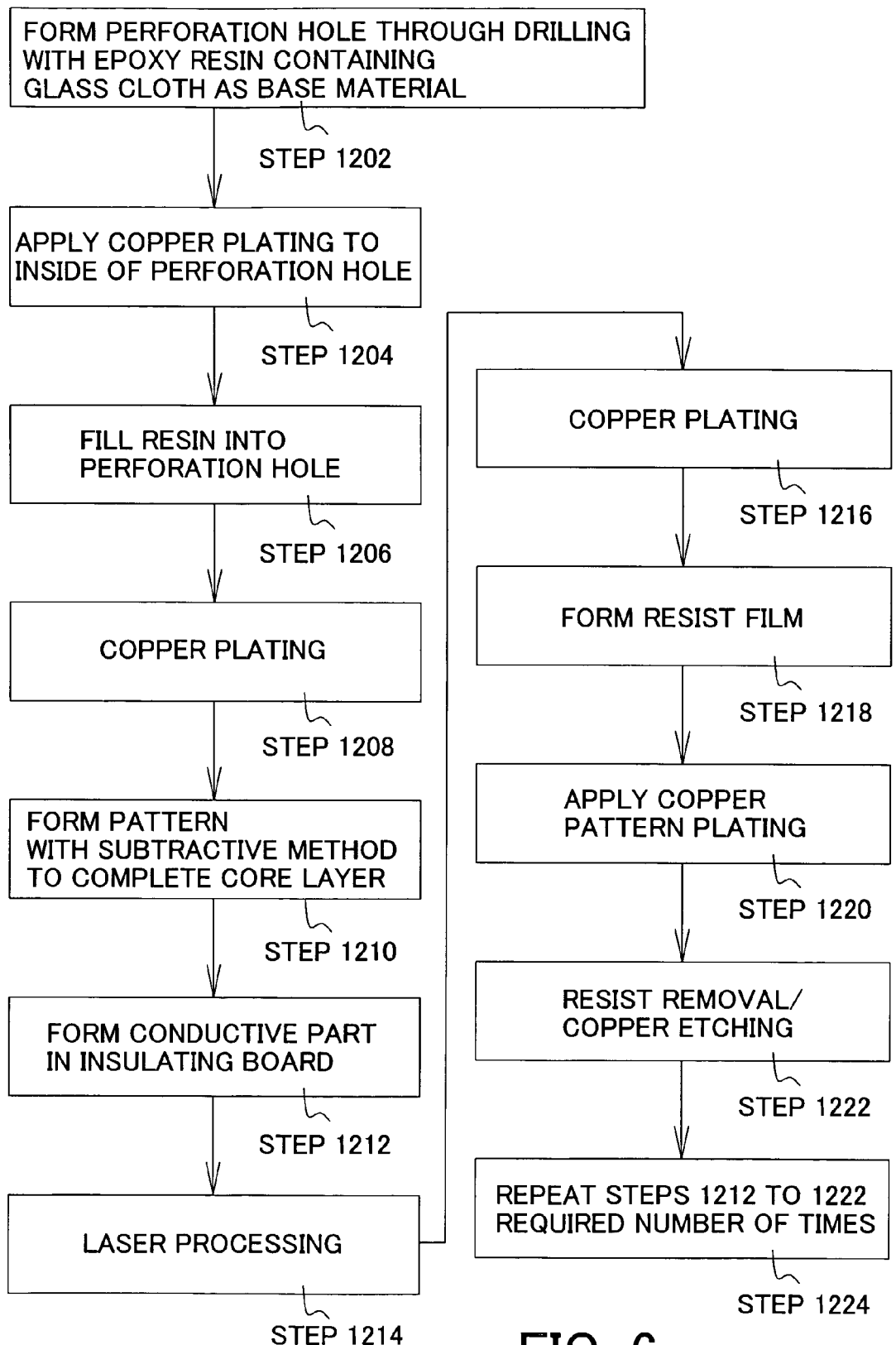
FIG. 6 is a flow chart showing a manufacturing process of a buildup layer used in the buildup board in Embodiment 1.

An example of the manufacturing method of the buildup layer including the core will hereinafter be described with reference to FIGS. 6 to 8. FIG. 6 is a flow chart for explaining the manufacturing method of the buildup layer 140. FIGS. 7A to 7G are schematic section views showing the respective steps for explaining the formation of the core part in FIG. 6. FIGS. 8A to 8G are schematic section views showing the respective steps for explaining the formation of the layered part in FIG. 6.

First, the core part of the buildup layer 140 is formed. As shown in FIG. 7A, epoxy resin 141 containing glass cloth with copper 142 attached on both sides thereof is prepared as a base material. As shown in FIG. 7B, a perforation hole 143 is formed through drilling in order to provide conduction between the front and back surfaces (step 1202). Next, as shown in FIG. 7C, copper plating 144 is applied to the inside of the perforation hole 143 (step 1204).

Then, as shown in FIG. 7D, resin 145 is filled into the perforation hole 143 (step 1206). Next, as shown in FIG. 7E, copper plating 146 referred to as lid plating is applied to the front surface (step 1208). Finally, as shown in FIG. 7F, a pattern 147 is formed through etching with the subtractive method to complete the core part (step 1210).

Figure 8A:
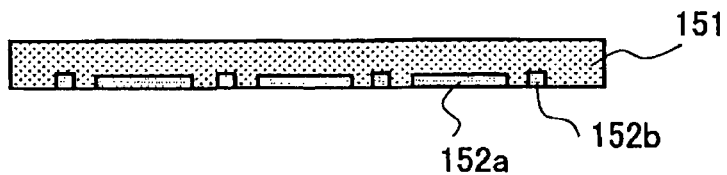
FIGS. 8A to 8G are schematic diagrams showing the manufacturing process of the buildup layer in Embodiment 1.

Next, the layered part is formed on both sides of the core part to complete the buildup layer 140. First, as shown in FIG. 8A, a conductive part 152a corresponding to the through-hole of the core layer 110 and a conductive part 152b for wiring are formed in an insulating board 151 through copper plating (step 1212).

Figure 8B:
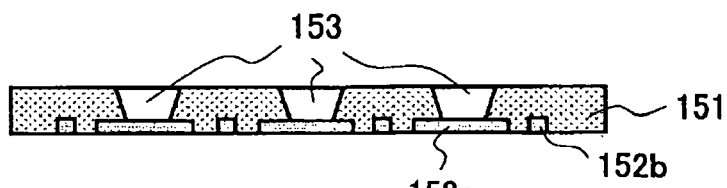

Then, as shown in FIG. 8B, laser hole processing is performed to form a hole 153 which exposes the conductive part (the copper plating) 152a (step 1214).

Figure 8C:
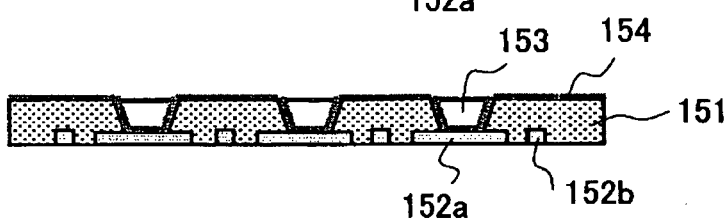
Figure 8D:
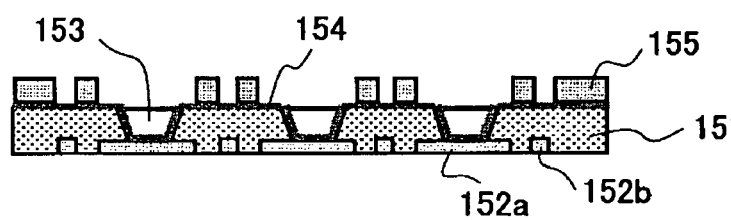
Figure 8E:
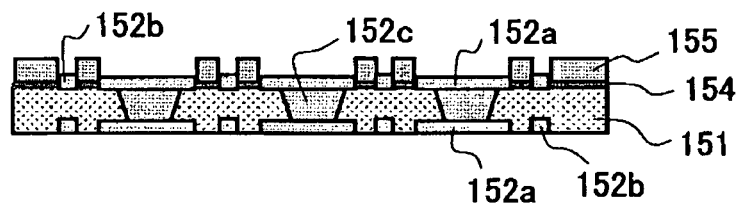

Next, as shown in FIG. 8C, electroless copper plating 154 is applied (step 1216). Then, as shown in FIG. 8D, a resist film 155 is formed to have openings at the positions corresponding to the conductive parts 152a and 152b (step 1218). In addition, as shown in FIG. 8E, copper pattern plating is applied (step 1220). As a result, the conductive parts 152a and 152b are formed on the upper surface of the insulating board 151 and the hole 153 is filled with the conductive part 152c.

Figure 8F:
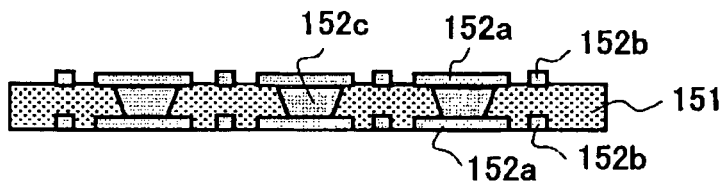
Figure 8G:
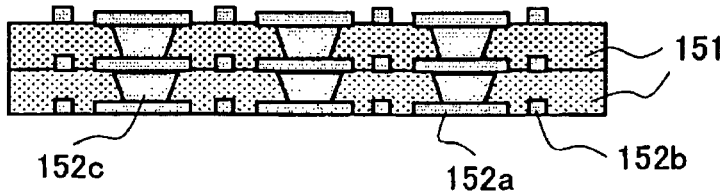

Then, as shown in FIG. 8F, resist removal/copper etching are performed (step 1222). Next, as shown in FIG. 8G, steps 1212 to 1222 are repeated to form the buildup layer 140 having a required number of layers (step 1224).

Finally, as shown in FIG. 7G, the buildup layer 140 is completed by repeating the steps in FIGS. 8A to 8G on the front and back of the core part in FIG. 7F. The buildup layer 140 is subjected to a non-defective determination before it is bonded to the core layer 110, and only non-defective items are used at step 1700.

Figure 9A:
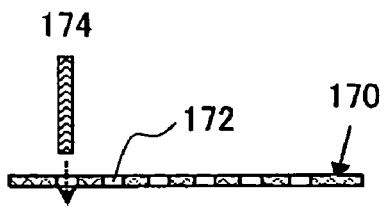
FIGS. 9A to 9F are schematic diagrams showing the manufacturing process of the buildup board in Embodiment 1.

Next, at step 1300 in FIG. 2, an insulating adhesive sheet 170 is patterned as shown in FIG. 9A. The insulating adhesive sheet 170 is made, for example of epoxy resin, and various types of insulating adhesive sheets are commercially available. The epoxy resin is a thermosetting adhesive and hardens at 150° C. However, the epoxy resin softens at approximately 80° C. and comes into close contact with the core layer 110 to exhibit a provisional securing effect.

The height of the insulating adhesive sheet 170 determines the amount of a conductive adhesive 180. A perforation hole 172 is formed in the insulating adhesive sheet 170 with a drill 174 at the position corresponding to the part where the core layer 110 is electrically connected to the buildup layer 140. While FIG. 9A shows the perforation holes 172 at regular intervals, this arrangement is illustrative. The insulating adhesive sheet 170 has a rectangular or circular shape to match the shape of the core layer 110 in Embodiment 1, and for example, has holes for positioning at four positions (for example, at the corners of the rectangular shape).

Figure 9B:
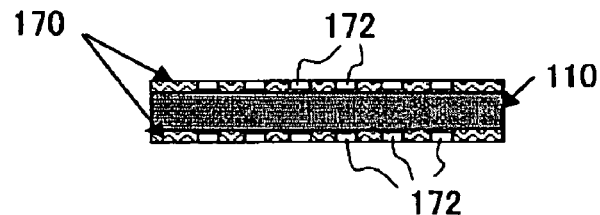

Next, as shown in FIG. 9B, a pair of insulating adhesive sheets 170 is positioned and provisionally secured to both sides of the core layer 110 (step 1400). The perforation hole 172 is positioned at the part where the core layer 110 is electrically connected to the buildup layer 140, that is, at an electric connection pad part. In Embodiment 1, the core layer 110 and the insulating adhesive sheet 170 are positioned by aligning their positioning holes and inserting pins into them. In this manner, Embodiment 1 utilizes a mechanical positioning means, but the present invention does not limit the positioning means. For example, marks for alignment may be formed in both of them to achieve positioning with an optical means.

The provisional securing is performed by preliminarily heating the core layer 110 and the adhesive sheet 170, for example, to approximately 80° C. The positioning pins are pulled out after the heating. While the adhesive sheet 170 is positioned and provisionally secured to the core layer 110 in Embodiment 1, it may be provisionally secured and fixed to the buildup layer 140.

Next, the conductive adhesive 180 is prepared (step 1500). The conductive adhesive contains, in the adhesive (for example, epoxy resin), metallic particles which have a first melting point, serve as a filler, and are plated with solder having a second melting point lower than the first melting point.

The adhesive as a base material contained in the conductive adhesive 180 of Embodiment 1 is epoxy resin, and it has a thermosetting temperature of 150° C. The metallic particles have a high melting point in Embodiment 1, such as Cu, Ni, etc., and its melting point is preferably higher than the thermosetting temperature of the adhesive as the base material. The solder in Embodiment 1 is low-temperature solder, and for example, made of Sn—Bi with a melting point of 138° C. The melting point of the low-temperature solder is preferably lower than the thermosetting temperature of the adhesive as the base material to prevent the setting of the adhesive under heat before the solder melts.

In this manner, the conductive adhesive 180 contains the conductive filler which includes the metallic particles with the high melting point as the core plated with the low-temperature solder. Powders of metallic particles with various diameters are commercially available. In Embodiment 1, electroless plating is used for the plating of the surfaces of the metallic particles. The plating thickness on the surfaces of the metallic particles is, for example, controllable by the soaking time period in the solution. Of course, the present invention does not limit the plating method.

The conductive adhesive 180 includes hardener that contains one of carboxyl, amine, and phenol, and organic acid that contains carboxylic acid of one of adipic acid, succinic acid and sebacic acid. This can improve the solder activation (or wettability), that is, the permeability into the core layer while oxidation is prevented.

Figure 9C:
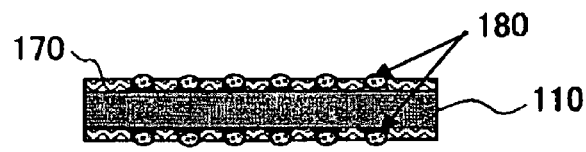

Next, as shown in FIG. 9C, the conductive adhesive 180 is filled into the perforation hole 172 (step 1600). In Embodiment 1, screen printing with a metal mask is used for the filling, but the present invention does not limit the type of the filling method.

Figure 9D:
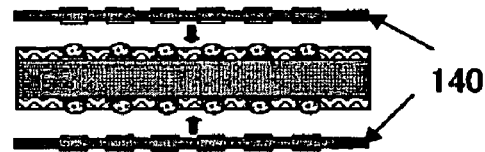
Figure 9E:
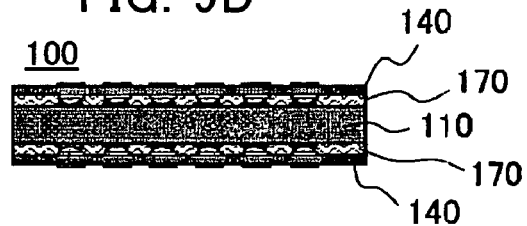

Next, as shown in FIG. 9D, the multilayer buildup layers 140 are positioned on both sides of the core layer 110 and bonded thereto through heating and pressure application (step 1700). The positioning in Embodiment 1 is performed similarly to the positioning between the core layer 110 and the adhesive sheet 170, specifically by aligning positioning holes in the adhesive sheet 170 with positioning holes in the buildup layer 140 and inserting pins into these positioning holes. The heating and pressure application are performed through pressing in a vacuum environment (also referred to as "vacuum lamination"). Thus, as shown in FIG. 9E, the buildup board 100 is completed which has the core layer 110 and the buildup layers 140 before the edge layer 160 is formed.

In Embodiment 1, it is determined whether or not the core layer 110 is non-defective and whether or not the buildup layer 140 is non-defective before the core layer 110 and the buildup layer 140 are bonded together, and only the non-defective core layers 110 and buildup layers 140 are used for the bonding at the step 1700. The yield can be improved by the non-defective item determination made before the manufacture of the layered board 100 is completed.

Since Embodiment 1 employs the low-temperature solder, the solder melts at a melting point lower than that of normal solder. It is thus possible to reduce the thermal stress and strain applied between the core layer 110 and the buildup layer 140 when the temperature returns to the room temperature from the high temperature during the heating, thereby preventing damages on both layers and the bonding layer. In addition, the high melting point of the metallic particles causes the melting point of the conductive adhesive 180 to be higher than that of the low-temperature solder, so that the remelting temperature can be increased. Consequently, even when a circuit device is mounted in the subsequent process, remelting of the conductive adhesive 180 which would result in reduced adhesion reliability can be prevented. The metallic particles can maintain the conductivity between the core layer 110 and the buildup layer 140.

Figure 9F:
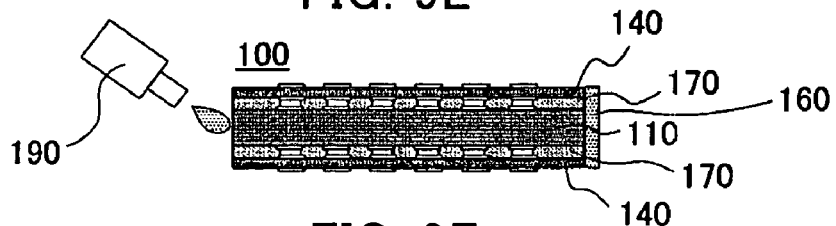

Next, as shown in FIG. 9F, epoxy resin is applied by a dispenser 190 with a predetermined thickness to the edges on the periphery of the core layer 110 and the buildup layer 140 and hardened to form the edge layer 160 (step 1800). The epoxy resin applied in Embodiment 1 has a coefficient of thermal expansion of 20 ppm/° C. after the hardening, that is, a higher coefficient of thermal expansion than the coefficient of thermal expansion of the core layer 110. As seen from experiment results, later described, the coefficient of thermal expansion of the edge layer 160 is preferably equal to or lower than the coefficient of thermal expansion of the buildup layer 140. However, if certain effect of stress relief can be provided even when the coefficient of thermal expansion of the edge layer 160 is higher than the coefficient of thermal expansion of the buildup layer 140, the edge layer 160 with a higher coefficient of thermal expansion than that of the buildup layer 140 may be provided in the present invention.

It should be noted that the edge layer 160 can be provided not only with the abovementioned method but also with various methods of forming a resin layer. For example, adhesive resin of a sheet type may be adhered to the edges on the periphery of the core layer 110 and the buildup layer 140, an organic material such as glass epoxy resin (FR4) may be applied and hardened, or a sheet of the organic material may be adhered.

Figure 10:
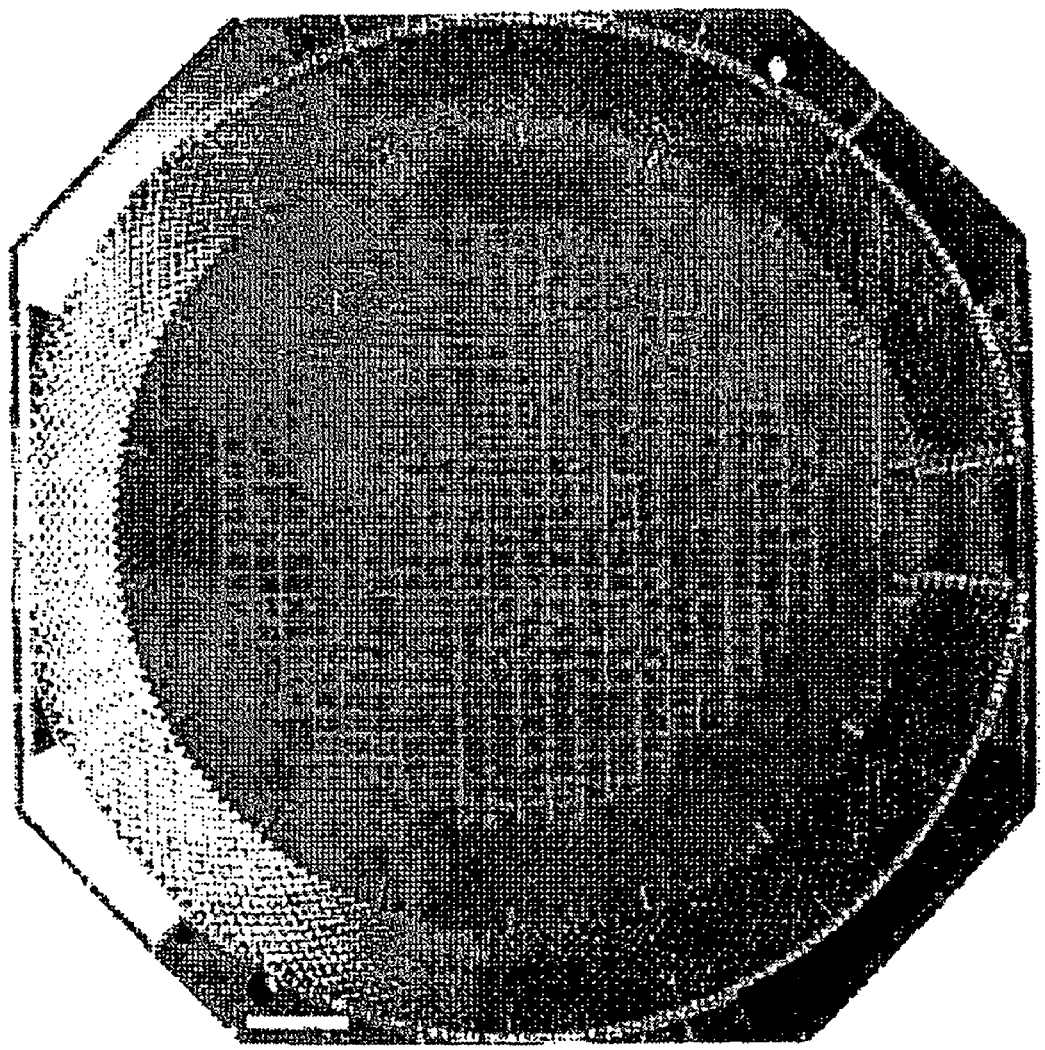
FIG. 10 is a plan view showing a tester board for LSI which employs the buildup board in Embodiment 1.

FIG. 10 shows a top view of a tester board (an electronic apparatus) 200 for LSI wafers, to which the buildup board 100 of Embodiment 1 is applied.

As shown in FIG. 2, the temperature cycling test is performed (step 1900) on the completed buildup board 100 or the buildup board 100 assembled as the tester board 200. In the temperature cycling test, for example, cooling for approximately several to 30 minutes in a cooler at a temperature of −65° C. and heating for the same time period in a heating furnace at 150° C. is defined as one cycle, and this cycle is repeated 100 to several hundreds of times, or approximately 1000 times.

As described above, the core layer 110 has a small coefficient of thermal expansion in the in-plane direction (0 to 17 ppm/° C., and desirably 10 ppm/° C. or lower), while the buildup layer 140 has a coefficient of thermal expansion of 20 ppm/° C. in the in-plane direction, which is higher than that of the core layer 110 since it contains the glass epoxy resin as its base material. In this case, in the temperature cycling test, large shearing stress works on the core layer resulting from the difference in coefficient of thermal expansion between the core layer and the buildup layer as explained above. Particularly, when the core layer 110 has a coefficient of thermal expansion of 1 ppm/° C. which is significantly lower than the coefficient of thermal expansion of the buildup layer 140, for example, the produced shearing stress is so large that it excesses the breaking strength of the core layer 110.

In Embodiment 1, however, the shearing stress mainly works on the edge layer 160 and large shearing stress is not applied to the core layer 110. In other words, the stress relieve effect of the edge layer 160 reduces the shearing stress applied to the core layer 110. Thus, even when the core layer 110 has a coefficient of thermal expansion significantly lower than the coefficient of thermal expansion of the buildup layer 140, cracks can be prevented from occurring in the core layer 110.

In FIG. 11, Case A shows a relationship between a width w of the edge layer 160 (the thickness in the in-plane direction in the buildup board) and the shearing stress working on the core layer 110 in Embodiment 1. In FIG. 11, the horizontal axis represents the width of the edge layer, while the vertical axis represents the maximum shearing stress working on the core layer 110.

FIG. 11 shows the result of an experiment (simulation) for investigating the shearing stress working on the core layer at a temperature of −65° C. when the core layer 110 had a thickness of 2.5 mm and a coefficient of thermal expansion of 1 ppm/° C., the buildup layer 140 had a thickness of 0.3 mm and a coefficient of thermal expansion of 20 ppm/° C., and the edge layer 160 had a coefficient of thermal expansion of 20 ppm/° C. In FIG. 11, E shows the shearing stress (breaking strength) at which a crack occurs in only the core layer. Each of the core layer 110 and the buildup layer 140 had a rectangular shape with a size of 500 mm by 500 mm, and the edge layer 160 was provided on the edges over the entire periphery of the core layer 110 and the buildup layer 140.

As seen from FIG. 11, the provision of the edge layer 160 can reduce the shearing stress working on the core layer 110 as compared with the case where no edge layer is provided (w=0). When the width of the edge layer 160 is larger than 1 mm, the shearing stress working on the core layer 110 is below the breaking strength E. Particularly, when the width of the edge layer 160 is equal to or larger than 2 mm (for example, equal to or larger than half the thickness of the core layer 110), sufficient effect of stress relief can be provided.

In FIG. 12, Case C shows the result of simulation for investigating the relationship between the coefficient of thermal expansion of the edge layer 160 (in this case, shown by a difference in coefficient of thermal expansion calculated by subtracting the coefficient of thermal expansion of the buildup layer from the coefficient of thermal expansion of the edge layer 160) and the shearing stress working on the core layer 110 at a temperature of −65° C. in Embodiment 1. In FIG. 12, the horizontal axis represents the difference in coefficient of thermal expansion, while the vertical axis represents the maximum shearing stress working on the core layer 110.

Again, in this case, the core layer 110 had a thickness of 2.5 mm and a coefficient of thermal expansion of 1 ppm/° C., and the buildup layer 140 had a thickness of 0.3 mm and a coefficient of thermal expansion of 20 ppm/° C. The width of the edge layer 160 was fixed to 2 mm. In FIG. 12, E shows the breaking strength. Each of the core layer 110 and the buildup layer 140 had a rectangular shape with a size of 500 mm by 500 mm, and the edge layer 160 was provided on the edges over the entire periphery of the core layer 110 and the buildup layer 140.

As seen from FIG. 12, when the coefficient of thermal expansion of the edge layer 160 is equal to or slightly higher than the coefficient of thermal expansion of the buildup layer 140 (when the difference in coefficient of thermal expansion is 0 to +2 ppm/° C.), and when the coefficient of thermal expansion of the edge layer 160 is lower than the coefficient of thermal expansion of the buildup layer 140 (when the difference in coefficient of thermal expansion is a negative value), the shearing stress working on the core layer 110 was below the breaking strength E. It can be seen from the fact that sufficient effect of stress relief can be provided for the core layer when the coefficient of thermal expansion of the edge layer 160 is equal to or lower than the coefficient of thermal expansion of the buildup layer 140. In practice, sufficient effect of stress relief can be provided by setting the coefficient of thermal expansion of the edge layer 160 to a value closer to (including a value identical to) the coefficient of thermal expansion of the buildup layer 140 than the coefficient of thermal expansion of the core layer 110.

In FIG. 13, Case D shows the relationship between a thickness t of the core layer 110 and the shearing stress working on the core layer 110 in Embodiment 1. In FIG. 13, the horizontal axis represents the thickness of the core layer, while the vertical axis represents the maximum shearing stress working on the core layer 110. FIG. 13 shows the result of an experiment (simulation) for investigating the shearing stress working on the core layer at a temperature of −65° C. when the core layer 110 had a coefficient of thermal expansion of 1 ppm/° C., the buildup layer 140 had a thickness of 0.3 mm and a coefficient of thermal expansion of 20 ppm/° C., and the edge layer 160 had a width of 2 mm and a coefficient of thermal expansion of 20 ppm/° C. In FIG. 13, E shows the breaking strength in only the core layer. Each of the core layer 110 and the buildup layer 140 had a rectangular shape with a size of 500 mm by 500 mm, and the edge layer 160 was provided on the edges over the entire periphery of the core layer 110 and the buildup layer 140.

As seen from FIG. 13, as the thickness of the core layer 110 is smaller, the shearing stress working on the core layer 110 is larger. Thus, it can be presumed from the results of Case A and Case C described above that the occurrence of cracks is avoided in the core layer 110 by setting a larger width of the edge layer 160 or a lower coefficient of thermal expansion of the edge layer 160 as the thickness of the core layer 110 is smaller.

As described above, according to Embodiment 1, the provision of the edge layer 160 at the edges on the periphery of the core layer 110 and the buildup layer 140 can reduce the shearing stress working on the core layer 110 to avoid the occurrence of cracks in the core layer 110 with the stress relief effect of the edge layer 160 even when the core layer 110 has a coefficient of thermal expansion largely different from that of the buildup layer 140. This can increase the life of the buildup board and the electronic apparatus which employs the buildup board compared with conventional ones.

Embodiment 2

Figure 14:
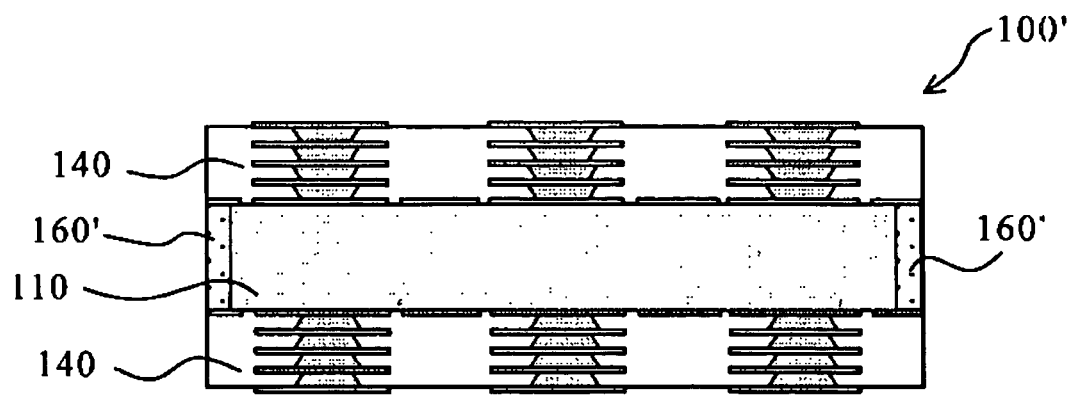
FIG. 14 is a section view of a buildup board which is Embodiment 2 of the present invention.

FIG. 14 shows the structure of a buildup board 100' which is Embodiment 2 of the present invention. Embodiment 1 has been described of the case where the sizes of both of the core layer 110 and the buildup layer 140 are matched such that the edge on the periphery of the core layer 110 is substantially flush with the edge on the periphery of the buildup layer 140 and the edge layer 160 is provided on the edges on the periphery of both of the core layer 110 and the buildup layer 140. In contrast, in Embodiment 2, the size of the core layer 110 in the in-plane direction is formed to be smaller than the size of the buildup layer 140 or the size of the buildup layer 140 is formed to be larger than the size of the core layer 110 to place the edge on the periphery of the core layer 110 on the inner side of the edge on the periphery of the buildup layer 140 in the in-plane direction. An edge layer 160' is provided only on the edge on the periphery of the core layer 110 in the same manner as that described in Embodiment 1, for example by applying epoxy resin by a dispenser to the space facing the edge on the periphery of the core layer 110 and sandwiched between the buildup layers 140 on both sides.

In Embodiment 2, the materials and structures of the core layer 110 and the buildup layer 140, and the material of the edge layer 160' (including the coefficients of thermal expansion) are substantially the same as those in Embodiment 1. The manufacturing process of the buildup board in Embodiment 2 is also substantially the same as that in the buildup board in Embodiment 1.

In Embodiment 2, similarly to Embodiment 1, shearing stress resulting from a difference in coefficient of thermal expansion between the core layer 110 and the buildup layer 140 focuses most on the edge layer 160', so that the shearing stress working on the core layer 110 is relieved. Thus, the occurrence of cracks in the core layer 110 can be avoided. The stress relief effect of the edge layer 160' on the core layer 110 is equivalent to the effect explained with reference to FIGS. 11 to 13 in Embodiment 1.

In Embodiment 1 described above, the size of the buildup board in the in-plane direction is increased by the width of the edge layer 160. In contrast, according to Embodiment 2, the core layer 110 is formed to be smaller in the in-plane direction than the buildup layer 140 when the edge part of the core layer 110 in the in-plane direction includes an extra area which is not used for electrical connection with the buildup layer 140, thereby making it possible to substantially match the edge on the periphery of the edge layer 160' with the edge on the periphery of the buildup layer 140. This can avoid an increase in size of the buildup board. However, the present invention does not eliminate the buildup layer 140 formed to be larger in the in-plane direction than the core layer 110 or the edge layer 160' projecting outward from the edge on the periphery of the buildup layer 140 in the in-plane direction.

The preferred relationship between the coefficient of thermal expansion of the edge layer 160 or 160' and the coefficients of thermal expansion of the core layer 110 and the buildup layer 140 is mentioned in Embodiments 1 and 2 described above. However, the present invention does not limit the coefficient of thermal expansion or the material of the edge layer as long as it has the effect of relieving the shearing stress working on the core layer 110 caused by the difference in coefficient of thermal expansion between the core layer 110 and the buildup layer 140.

Embodiment 3

Figure 15:
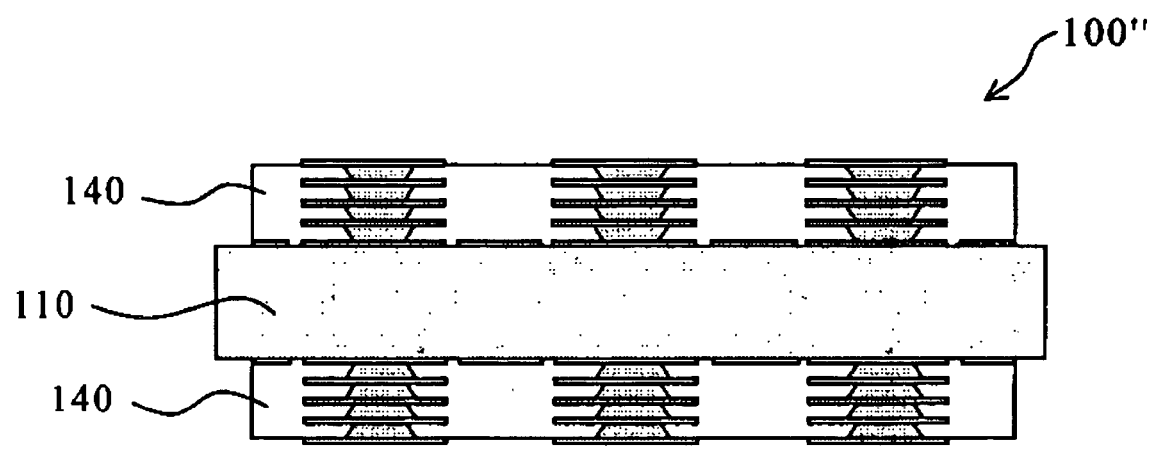
FIG. 15 is a section view of a buildup board which is Embodiment 3 of the present invention.

FIG. 15 shows the structure of a buildup board 100" which is Embodiment 3 of the present invention. In Embodiments 1 and 2, the edge layer 160 or 160' which is different from the core layer 110 is provided on the edge on the periphery of the core layer 110 to achieve the stress relief effect on the core layer 110. However, similar stress relief effect can also be provided by forming the core layer 110 to project outward from the edge on the periphery of the buildup layer 140 in the in-plane direction without forming the edge layer 160 as shown in FIG. 15.

The materials and structures of the core layer 110 and the buildup layer 140 are substantially the same as those in Embodiment 1. The manufacturing process of the buildup board in Embodiment 3 is the same as the manufacturing process of the buildup board in Embodiment 1 except for the formation of the edge layer (step 1800).

In FIG. 11, Case B shows a relationship between a projection amount w of the core layer 110 from the edge on the periphery of the buildup layer 140 and shearing stress working on the core layer 110 in Embodiment 3. In FIG. 11, the horizontal axis represents the projection of the core layer, while the vertical axis represents the maximum shearing stress working on the core layer 110.

FIG. 11 shows the result of an experiment (simulation) for investigating the shearing stress working on the core layer at a temperature of −65° C. when the core layer 110 had a thickness of 2.5 mm and a coefficient of thermal expansion of 1 ppm/° C., and the buildup layer 140 had a thickness of 0.3 mm and a coefficient of thermal expansion of 20 ppm/° C. In FIG. 11, E shows the breaking strength in only the core layer. The core layer 110 had a rectangular shape with a size of 500 mm by 500 mm, and the core layer 110 projected from the edge on the periphery of the buildup layer 140 over the entire periphery of the buildup board.

As seen from FIG. 11, the core layer projecting from the edge on the periphery of the buildup layer 140 can reduce the shearing stress working on the core layer 110 as compared with the case where the core layer does not project (w=0). When the projection amount is larger than 0.7 mm, the shearing stress working on the core layer 110 is below the breaking strength E. Particularly, when the projection amount w is equal to or larger than 1.3 mm (for example, equal to or larger than half the thickness of the core layer), sufficient effect of stress relief can be provided.

According to Embodiment 3, the core layer 110 formed to project from the edge on the periphery of the buildup layer 140 can reduce the shearing stress working on the core layer 110 to avoid the occurrence of cracks in the core layer 110 with the stress relief effect of the projection even when the core layer 110 has a coefficient of thermal expansion largely different from that of the buildup layer 140.

Figure 16A:
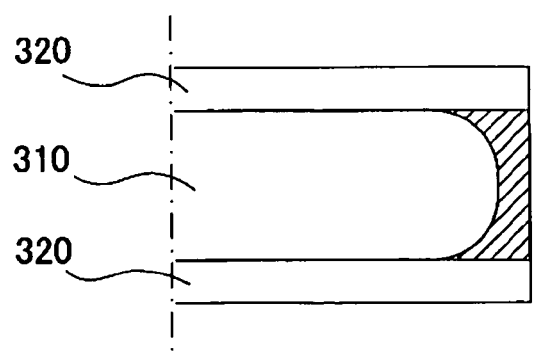
FIGS. 16A to 16D are schematic diagrams showing the distribution of shearing stress in the buildup boards of Embodiments 1 to 3.
Figure 16B:
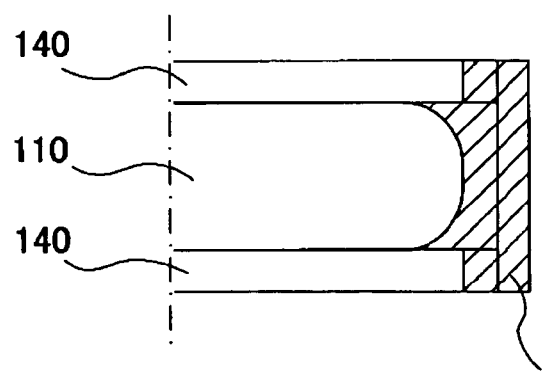
Figure 16C:
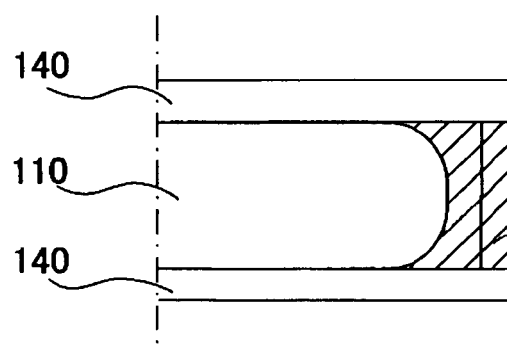
Figure 16D:
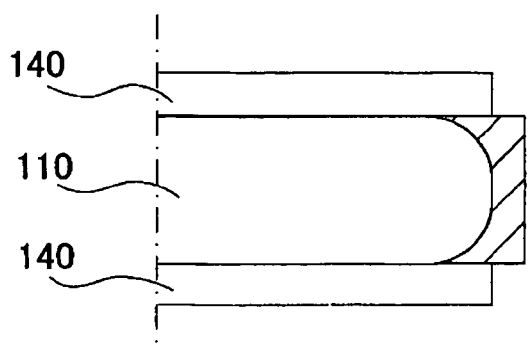
Figure 17:
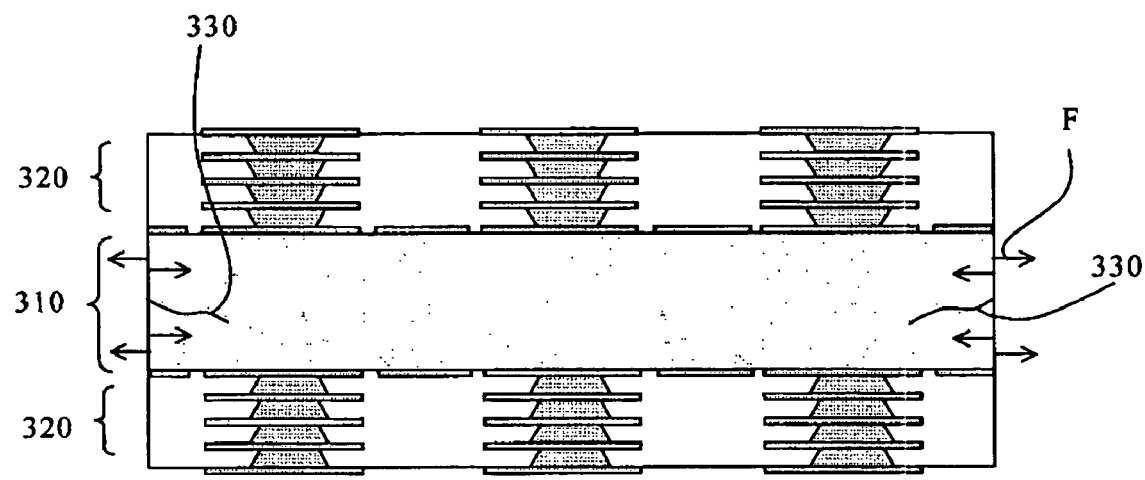
FIG. 17 is a section view of a conventional buildup board.

Finally, FIGS. 16A to 16D show a comparison of the shearing stress working on the core layers of the buildup boards of Embodiments 1 to 3 and a conventional buildup board. FIG. 16A shows the shearing stress working on the conventional buildup board. FIGS. 16B, 16C, and 16D show the shearing stress working on the buildup boards of Embodiments 1 to 3, respectively.

In FIGS. 16A to 16D, each of hatched areas represents an area to which the maximum shearing stress is applied, and finer hatch lines represent larger shearing stress. For example, according to the experiment results of Embodiments 1 and 3 shown FIGS. 11 and 13, respectively, and the experiment result of Embodiment 2 under the same conditions, the maximum shearing stress values were 30 MPa, 29.85 MPa, and 28.23 MPa, respectively, when the widths of the edge layers in FIGS. 16B and 16C and the projection amount of the core layer in FIG. 16D were 2 mm. In contrast, the maximum shearing stress was 33.53 MPa in the conventional buildup board shown in FIG. 16A.

As described above, according to Embodiments 1 to 3, the shearing stress resulting from the difference in coefficient of thermal expansion between the buildup layer and the core layer mainly focuses on the edge layer provided for the edge on the periphery of the core layer. Thus, the edge layer has the function of relieving the shearing stress working on the core layer. Consequently, cracks in the core layer due to the shearing stress can be prevented effectively in the temperature cycling test and the like. This can realize a layered board having a structure resistant to temperature changes and an electronic apparatus having the layered board.

The edge layer may be formed at the edge on the periphery of the core layer and the buildup layer. Alternatively, it is possible that the edge on the periphery of the core layer is placed on the inner side of the edge on the periphery of the buildup layer and the edge layer is formed only at the edge on the periphery of the core layer. In both cases, equivalent stress relief effect can be achieved.

To prevent cracks in the core layer more effectively, the coefficient of thermal expansion of the edge layer is preferably set to be higher than the coefficient of thermal expansion of the core layer. In addition, more remarkable stress relief effect can be provided by setting the coefficient of thermal expansion of the edge layer to a value equal to or lower than the coefficient of thermal expansion of the buildup layer or a value closer to the coefficient of thermal expansion of the buildup layer than that of the core layer.

The core layer may project from the edge on the periphery of the buildup layer. For example, the core layer may be formed to be larger than the buildup layer to project part of the core layer from the edge on the periphery of the buildup layer. This can reduce the abovementioned concentration of the shearing stress on the edge on the periphery of the core layer to prevent the occurrence of cracks in the core layer.

While preferred embodiments have been described, the present invention is not limited to these embodiments and various modifications and variations are possible.

For example, the present invention is widely applicable not only a tester board for LSI wafers but also to a buildup board for use in electronic apparatuses such as laptop personal computers (PCs), digital cameras, servers, cellular phones, etc.

What is claimed is:

1. A layered board comprising:
   a core layer which serves as a printed board;
   a buildup layer which includes an insulation part and a wiring part, is overlaid on said core layer, and is electrically connected to said core layer; and
   an edge layer formed at least at an edge on a periphery of said core layer, said edge layer being made of a material different from that of said core layer,
   wherein said edge layer is formed at the edge on the periphery of said core layer and at an edge on the periphery of said buildup layer.

2. A layered board according to claim 1, wherein a periphery of said buildup layer projects outward from the edge on the periphery of said core layer, and at least a part of said edge layer is formed under the periphery of said buildup layer.

3. A layered board according to claim 1, wherein said buildup layer includes a first buildup layer overlaid on the front side of said core layer and a second buildup layer overlaid on the back side of said core layer.

4. A layered board according to claim 1, wherein a coefficient of thermal expansion of said edge layer is higher than a coefficient of thermal expansion of said core layer.

5. A layered board according to claim 1, wherein a coefficient of thermal expansion of said edge layer is equal to or lower than a coefficient of thermal expansion of said buildup layer.

6. A layered board according to claim 1, wherein a coefficient of thermal expansion of said edge layer is closer to a coefficient of thermal expansion of said buildup layer than a coefficient of thermal expansion of said core layer.

7. A layered board according to claim 1, wherein a coefficient of thermal expansion of said core layer is lower than a coefficient of thermal expansion of said buildup layer.

8. An electronic apparatus comprising:
   a layered board according to claim 1.

9. A layered board comprising:
   a core layer which serves as a printed board;
   a buildup layer which includes an insulation part and a wiring part, is overlaid on said core layer, and is electrically connected to said core layer; and
   an edge layer formed at least at an edge on a periphery of said core layer, said edge layer being made of a material different from that of said core layer,
   wherein said buildup layer includes a first buildup layer overlaid on the front side of said core layer and a second buildup layer overlaid on the back side of said core layer, and
   wherein peripheries of said first and second buildup layers project outward from the edge on the periphery of said core layer, and said edge layer is sandwiched between the peripheries of said first and second buildup layers.

10. A layered board comprising:
    a core layer which serves as a printed board;
    a buildup layer which includes an insulation part and a wiring part, is overlaid on said core layer, and is electrically connected to said core layer; and
    an edge layer formed at least at an edge on a periphery of said core layer, said edge layer being made of a material different from that of said core layer,
    wherein said edge layer is a resin layer.

11. A layered board comprising:
    a core layer which serves as a printed board;
    a buildup layer which includes an insulation part and a wiring part, is overlaid on said core layer, and is electrically connected to said core layer; and
    an edge layer formed at least at an edge on a periphery of said core layer, said edge layer being made of a material different from that of said core layer,
    wherein said edge layer is formed over the entire periphery of said core layer.

* * * * *